United States Patent [19]

Johnson

[11] Patent Number: 5,481,213
[45] Date of Patent: Jan. 2, 1996

[54] CROSS-CONDUCTION PREVENTION CIRCUIT FOR POWER AMPLIFIER OUTPUT STAGE

[75] Inventor: Nicky M. Johnson, Los Altos, Calif.

[73] Assignee: National Semiconductor Corporation, Santa Clara, Calif.

[21] Appl. No.: 168,443

[22] Filed: Dec. 17, 1993

[51] Int. Cl.$^6$ .......................... H03K 3/00; H03K 17/16; G06G 7/12; H03F 3/45
[52] U.S. Cl. .................. 327/108; 327/112; 327/387; 327/391; 327/500; 327/562; 327/563; 330/253; 330/255
[58] Field of Search ..................... 327/108, 112, 327/387, 391, 560, 562, 563; 326/82, 83; 330/253, 255

[56] References Cited

U.S. PATENT DOCUMENTS

| | | | |
|---|---|---|---|
| 4,132,954 | 1/1970 | Sidhu | 327/560 |
| 4,292,478 | 9/1982 | Davis et al. | 327/560 |
| 4,963,837 | 10/1990 | Dedic | 330/255 |
| 4,988,954 | 1/1991 | Stern et al. | 330/264 |
| 5,266,887 | 11/1993 | Smith | 330/253 |
| 5,341,338 | 11/1994 | Hashiguchi et al. | 327/108 |

FOREIGN PATENT DOCUMENTS

| | | |
|---|---|---|
| 0297639 | 1/1989 | European Pat. Off. . |
| 0325299 | 7/1989 | European Pat. Off. . |
| 4002871 | 11/1990 | Germany . |

Primary Examiner—Timothy P. Callahan
Assistant Examiner—Trong Phan
Attorney, Agent, or Firm—Skjerven, Morrill, MacPherson, Franklin & Friel; Edward C. Kwok

[57] ABSTRACT

A structure for preventing simultaneous conduction in the power transistors of an output circuit of an audio system includes an auxiliary device in each of the high side control and low side control circuits controlling the power transistors. The auxiliary device in the high side control circuit is turned on simultaneously with the high side power transistor to provide a control signal to the low side control circuit, thereby turning off the low side power transistor. Conversely, the auxiliary device in the low side control circuit is turned on simultaneously with the low side power transistor to provide a control signal to the high side control circuit, thereby turning off the high side power transistor. Thus, simultaneous conduction in the high and low side power transistors is prevented.

8 Claims, 7 Drawing Sheets

CROSS-CONDUCTION PREVENTION CIRCUIT FOR POWER AMPLIFIER OUTPUT STAGE

BACKGROUND OF THE INVENTION

1. Field of the Invention

The present invention relates to the design of linear integrated circuits; and, in particular relates to the design of linear integrated circuits for audio applications, such as audio amplifiers.

2. Discussion of the Related Art

In an audio output circuit, an 8-ohm speaker is typically driven by a pair of power amplifiers in a bridge configuration. FIG. 1 shows such a configuration in a monophonic output circuit 100 of an audio system.

As shown in FIG. 1, signal 104 is amplified by gain amplifier 101. The output signal of gain amplifier 101 is then amplified by amplifiers 108 and 109 provided in a bridge configuration to drive an 8-ohm speaker 102. Note that the reference voltage on node 110 is voltage between a power supply $V_{dd}$ and a power supply $V_{ss}$.

The output current in each of amplifiers 108 and 109 is provided by two power transistors. FIG. 2 shows a typical output section in an audio output circuit. As shown in FIG. 2, power transistors 201 and 202 are provided to conduct current alternatively from the power supply $V_{dd}$ to output node 203, and from output node 203 to power supply $V_{ss}$. In FIG. 2, power transistors 201 and 202 are controlled respectively by high side control circuit 204 and low side control circuit 205, each receiving an input signal from an amplifier 206. To reduce the current drawn by circuit 100 from the power supply and hence reduce the dissipation of circuit 100, only one of power transistors 201 and 202 should be conducting at any given time. Simultaneous conduction is undesirable.

SUMMARY OF THE INVENTION

In accordance with the present invention, a circuit and a method are provided, in an output circuit of an audio system, to prevent simultaneous conduction of a high side power transistor and a low side power transistor. The circuit of the present invention includes coupled low side and high side control circuits. Each control circuit receives, in addition to conventional input signals, an auxiliary input signal, and provides, in addition to conventional output signals, an auxiliary output signal. The auxiliary input signal of the high side control circuit is coupled to the auxiliary output signal of the low side control circuit, and the auxiliary input signal of the low side control circuit is coupled to the auxiliary output signal of the high side control circuit. In accordance with the present invention, when each control circuit enables its associated power transistor, the control circuit activates also its auxiliary output signal to inhibit activation by the other control circuit of the other power transistor. In other words, under the present invention, when a control circuit receives an active auxiliary input signal, the control circuit turns off its associated power transistor. In this manner, simultaneous conduction in the low side and the high side power transistors is prevented.

In one embodiment of the present invention, the auxiliary input signal of each control circuit controls a transistor in the output stage of that control circuit.

In one embodiment of the present invention, both the high side and the low side control circuits receive as input a differential voltage. Each control circuit has a differential transconductance amplifier which provides as output of the control circuit a current corresponding to the input differential voltage.

Since the present invention provides high side and low side control circuits which are coupled to prevent simultaneous conduction in the output power transistors of an amplifier in an audio output circuit, the present invention provides an audio amplifier of reduced power dissipation.

The present invention is better understood upon consideration of the detailed description below and the accompanying drawings.

DETAILED DESCRIPTION OF PREFERRED EMBODIMENTS

Figure 1:
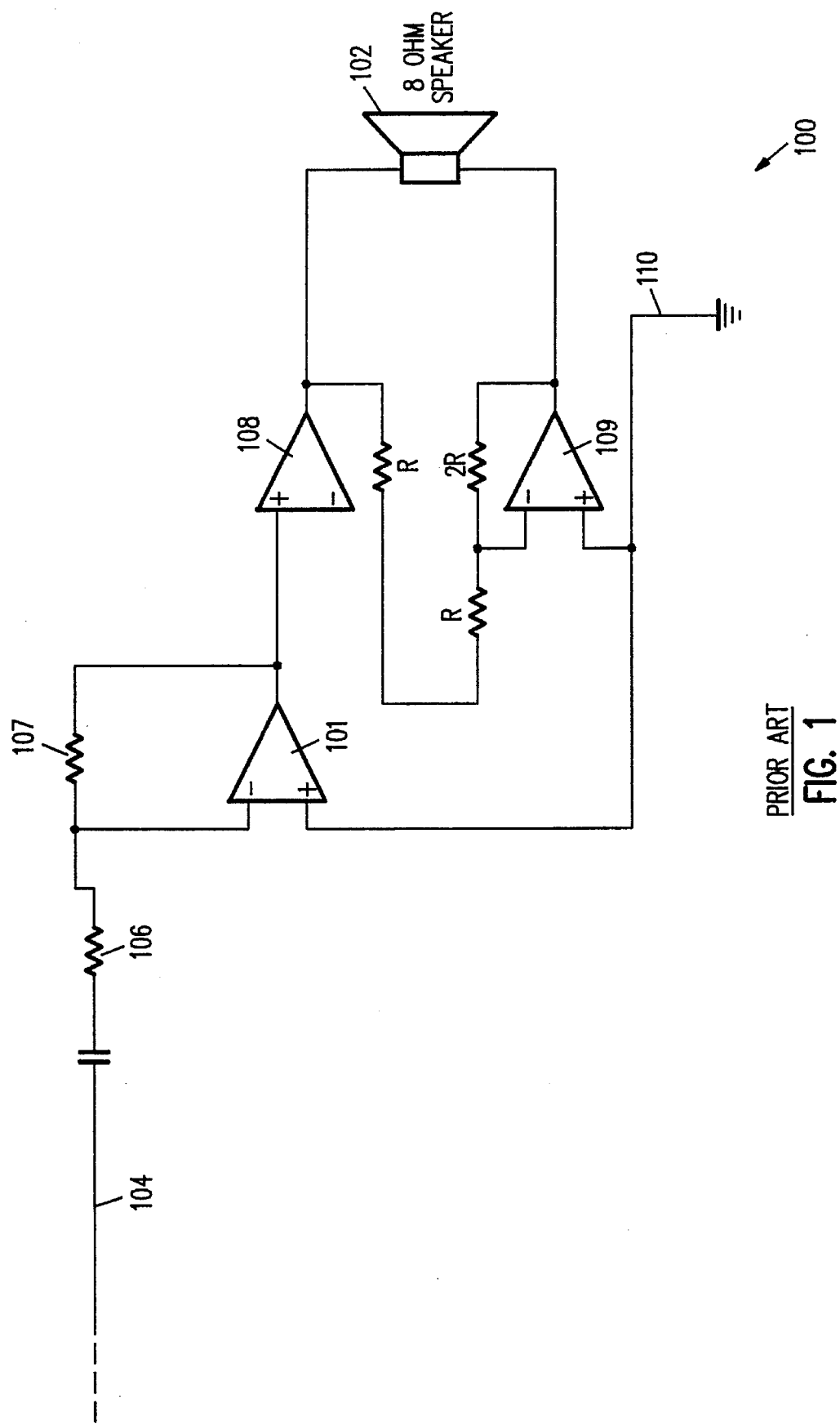
FIG. 1 shows a monophonic output circuit 100 of a stereo system driving an 8-ohm speaker 102 in a bridge configuration.
Figure 5:
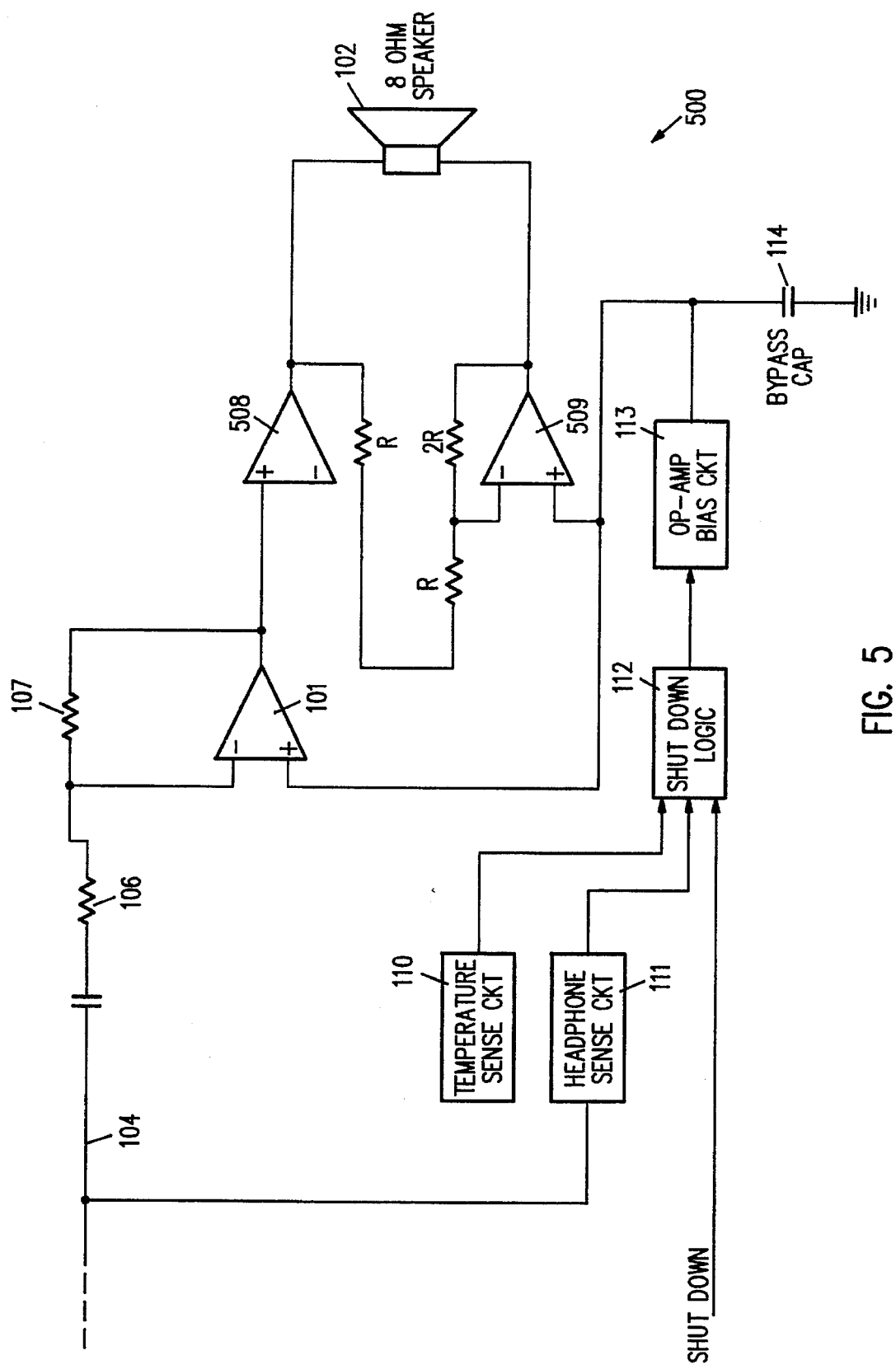
FIG. 5 shows an audio output circuit 500 in which the embodiment of the present invention shown in FIG. 3 is deployed.

An embodiment of the present invention is deployed in the amplifiers 508 and 509 of an audio output circuit 500 shown in FIG. 5. Audio output circuit 500 is similar to audio output circuit 100 shown in FIG. 1, except for shut-down logic circuit 112, "op-amp" bias circuit 113, which generates the bias voltages used in amplifiers 508 and 509 and disables output of current to speaker 102, earphone sense circuit 111 and temperature sensing circuit 110. To facilitate reference, like elements in FIGS. 1 and 5 are provided identical reference numerals. In FIG. 5, the output of current to speaker 102 is disabled by bias circuit 113 charging a capacitor 114. Shut-down logic circuit 112, which controls op-amp bias circuit 113, is responsive to a temperature sensing circuit 110 and a headphone sensing circuit 111. The operations of common elements in audio output circuits 100 and 500 already described above with respect to FIG. 1 is not repeated.

Figure 3:
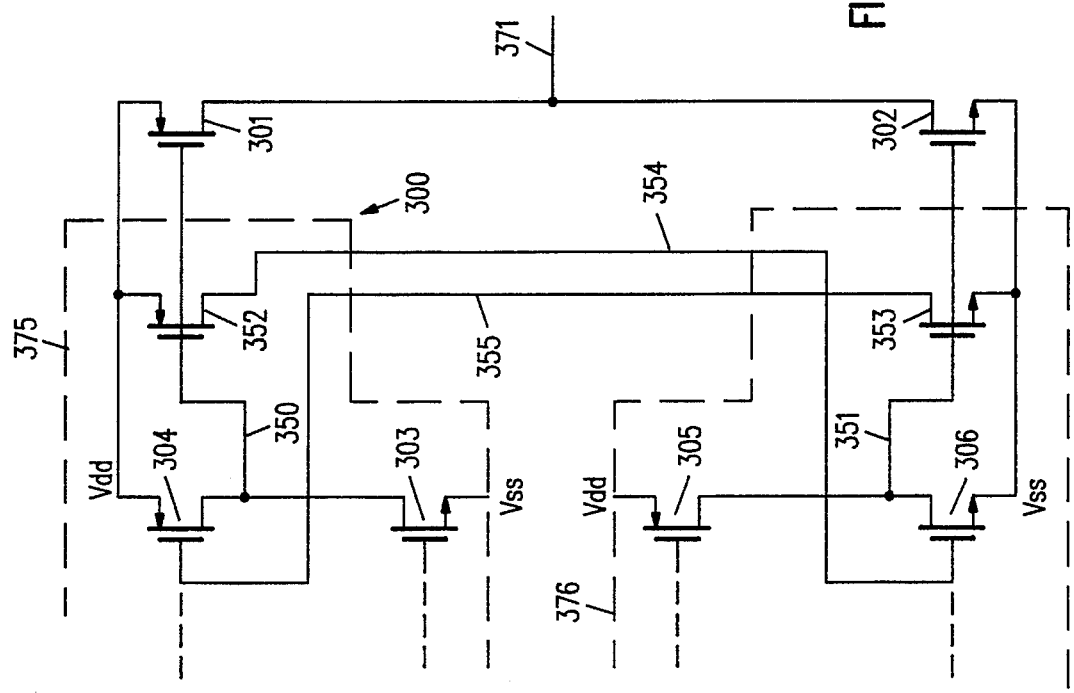
FIG. 3 shows an embodiment of the present invention in an output control circuit 300 driving power transistors 301 (PMOS) and 302 (NMOS) in an amplifier of an audio output circuit.
Figure 2:
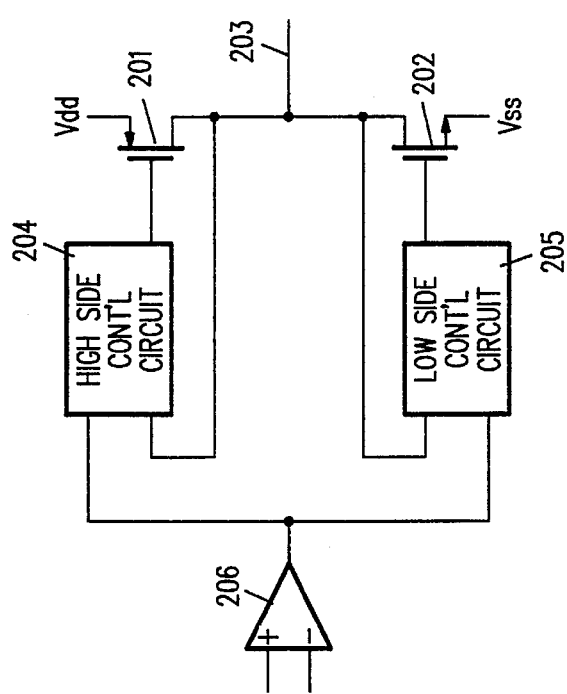
FIG. 2 shows a typical output section of an amplifier in an audio output circuit.

FIG. 3 is a schematic diagram of an embodiment of the present invention in an output control circuit 300 driving power transistors 301 (PMOS) and 302 (NMOS) of an audio output circuit. Control circuit 300 can be implemented, for example, in amplifier 508 or 509 of the audio output circuit 500 shown in FIG. 5. In FIG. 3, transistor 303 and 304 form an output stage of a high side control circuit 375, providing a control signal on lead 350 to control power transistor 301. Similarly, transistors 305 and 306 form an output stage of a low side control circuit 376, providing a control signal on lead 351 to control power transistor 302. Control signals on leads 350 and 351 are each also provided to control, respectively, PMOS transistor 352 and NMOS transistor 353. As shown in FIG. 3, the drain terminal 354 is coupled to the gate terminal of transistor 306 in the output stage of low side control circuit 376. Likewise, the drain terminal of NMOS transistor 353 is coupled to transistor 304 in the output stage of high side control circuit 375.

In the configuration of FIG. 3, when the voltage of the control signal on lead 350 decreases, both power transistor 301 and PMOS transistor 352 are turned on simultaneously. Consequently, the voltage on lead 354 is rapidly pulled to supply $V_{dd}$'s voltage, to turn on transistor 306 in the output stage of low side control circuit 376, thereby pulling the voltage of the control signal on lead 351 towards power supply $V_{ss}$'s voltage to shut off transistor 302. In the same manner, when the voltage of the control signal on lead 351 increases, both power transistor 302 and NMOS transistor 353 are turned on simultaneously. Consequently, the voltage on lead 355 is pulled towards power supply $V_{ss}$'s voltage to turn on transistor 304 of high side control circuit 375. Consequently, the voltage of the control signal on lead 350 is pulled towards power supply $V_{dd}$'s voltage, thereby turning off power transistor 301.

Thus, under the configuration of FIG. 3, when power transistor 301 is turned on, the action of transistor 352 turns off power transistor 302. Conversely, when power transistor 302 is turned on, the action of transistor 353 turns off power transistor 301. In this manner, FIG. 3's embodiment of the present invention ensures that power transistors 301 and 302 are not turned on simultaneously.

Figure 4A:
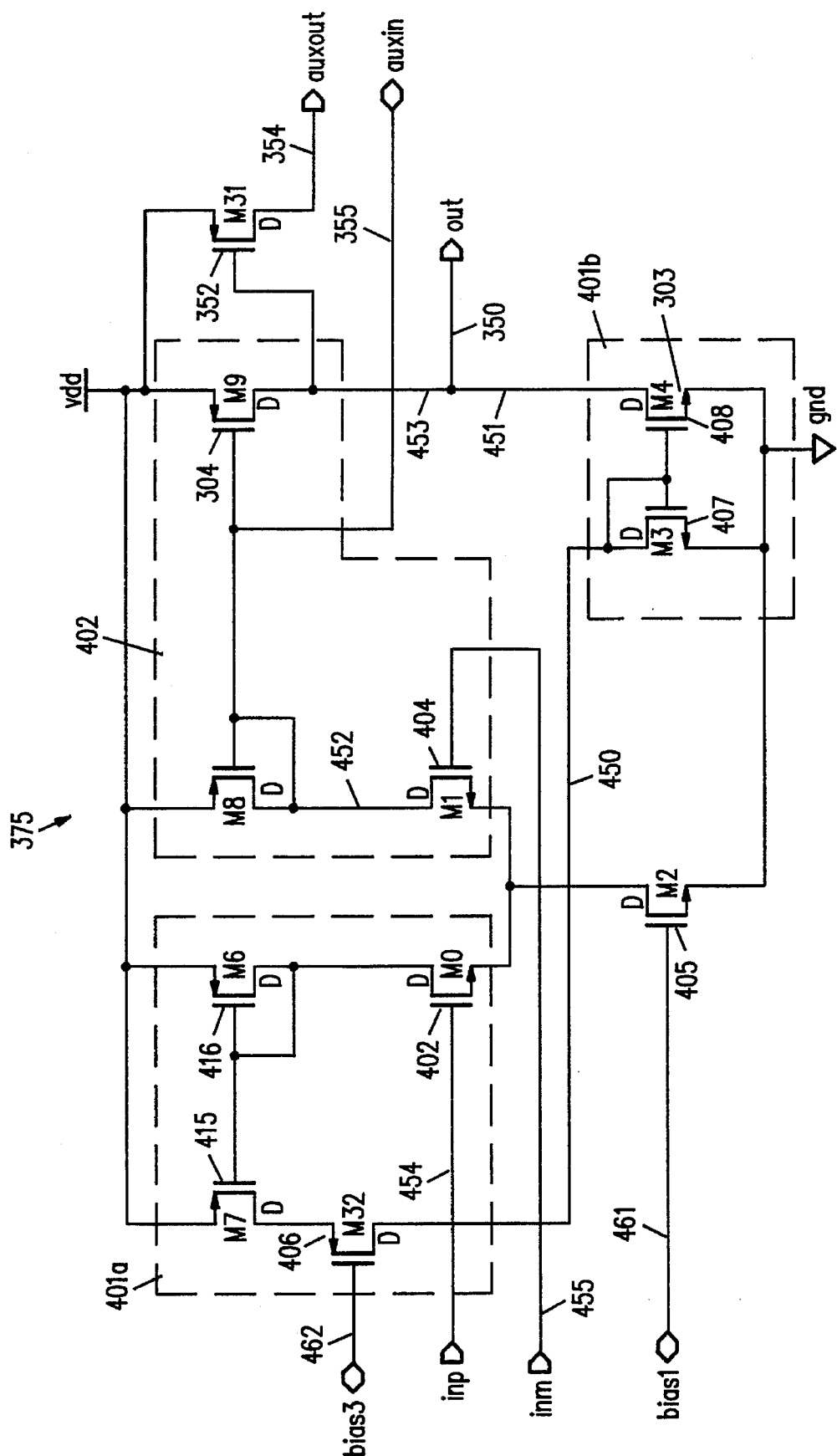
FIGS. 4a and 4b show, respectively, in further detail, high side control circuit 375 and low side control circuit 376.
Figure 4B:
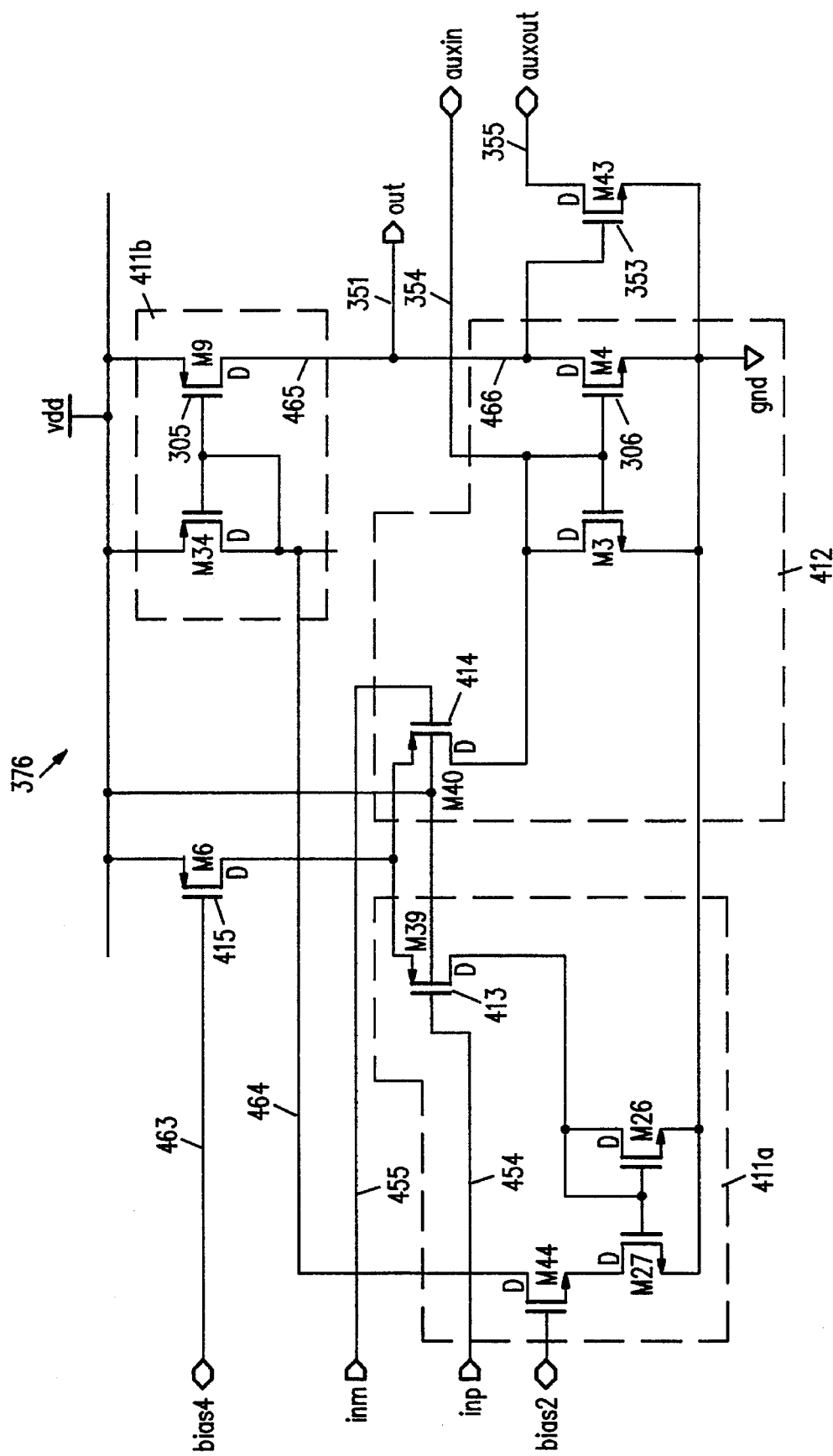

FIGS. 4a and 4b show, respectively, in further detail, high side control circuit 375 and low side control circuit 376. To facilitate the description, corresponding structures in FIGS. 3, 4a and 4b are given the same reference numerals.

As shown in FIG. 4a, in this embodiment, transistors 303 and 304 of the output stage of high side control circuit 375 are provided drawn W/L (channel width to channel length) ratios of 150/2 and 50/2. Under one CMOS process, a transistor having a 150/2 W/L ratio is fabricated as a transistor having a channel width of 120 microns and a channel length of 1.6 microns (i.e. a 0.8 shrink). Transistor 352 is shown to have a W/L ratio of 250/1. High side control circuit 375 includes a differential transconductance amplifier 475 formed by transistor 405 (W/L=100/2), circuits 401a, 401b and 402. Transistor 405 is biased by a bias voltage on lead 461 to act as a current source for differential transconductance amplifier. The differential transconductance amplifier is responsive to the differential voltage of leads 454 and 455, respectively controlling the currents in transistors 403 and 404. Transistors 403 and 404 are respectively given W/L ratios of 75/2 and 100/2 to provide a built-in bias.

The current in transistor 403, responsive to the voltage on lead 454, is reflected in circuit 401a to lead 450, which is in turn reflected in circuit 401b to provide an equivalent current through transistor 303 in lead 451. The current in transistor 404, responsive to the voltage on lead 455, is reflected in circuit 402 to provide an equivalent current through transistor 304 to lead 453. Thus, the output current on lead 350 is the difference between the currents through transistor 403 and 404, which correspond substantially to the differential voltage on leads 454 and 455. The output current in lead 350 also drives transistor 352, which provides a signal on lead 354 to low side control circuit 376 to turn off power transistor 302. Transistor 406 equalizes the drain voltages of transistors 415 and 416 to improve the performance of the current mirror in circuit 401a.

Low side control circuit 376 also includes a differential transconductance amplifier also responsive to the differential voltage on leads 454 and 455. Differential transconductance amplifier consists of transistor 415, which acts as a current source adjustable by a bias voltage on lead 463, and circuits 411a, 411b and 412. The voltage on lead 454 causes a current in transistor 413; this current in transistor 413 is reflected by circuits 411a and 411b to provide an equivalent current through transistor 305 in lead 465. Similarly, the voltage on lead 455 causes a current in transistor 414; this current in transistor 414 is reflected in circuit 412 to provide an equivalent current in lead 466 through transistor 306. Thus, the current in output lead 351 is the difference between the currents in transistors 413 and 414. The current in output lead 351 corresponds substantially to the differential voltage of leads 454 and 455. The output current in lead 351 is also used to drive transistor 353, which provides a signal on lead 355 to high side control circuit 375 to turn off power transistor 301.

Because there is a region within which the differential voltage on leads 454 and 455 is insufficient to turn on either power transistor 301 or 302 through high side or low side control circuits 375 and 376, a fill-in circuit is provided. This fill-in circuit provides a linear current for the region in which the differential voltage on leads 454 and 455 is insufficient to turn on either power transistor 301 or 302. An example of such a fill-in circuit, fill-in circuit 600, is shown in FIG. 4c.

Figure 4C:
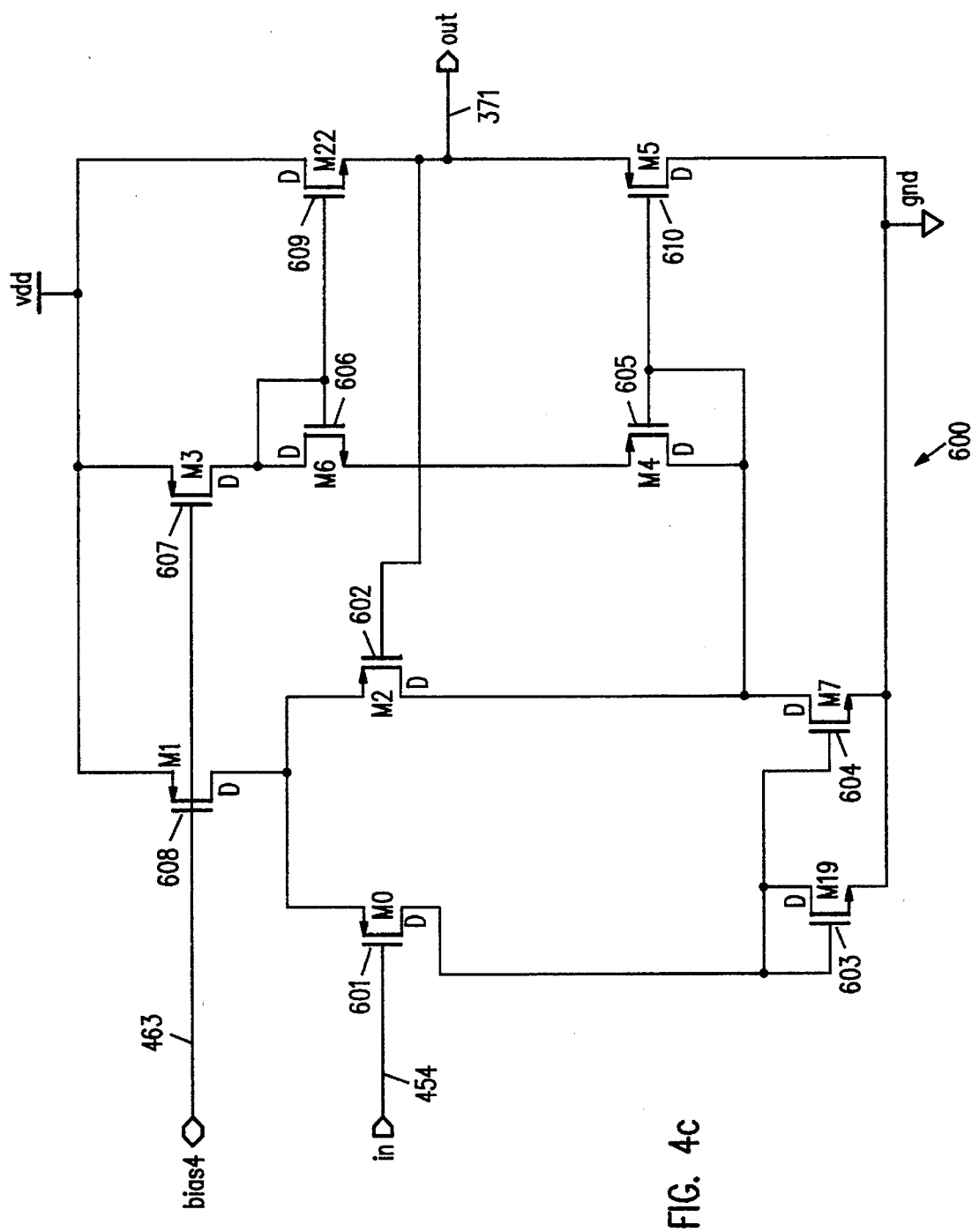
FIG. 4c shows a fill-in circuit 600 for providing an output current when the differential voltage at the input leads of high side control circuit 375 and low side control circuit 376 is insufficient to turn on either power transistor 301 or 302.

In FIG. 4c, circuit 600 includes a differential amplifier with negative feedback formed by transistors 601 and 602, which receives a differential voltage between output lead 371 and input lead 454. Operationally, the current flowing in both transistor 601 (W/L=250/2) and transistor 603 (W/L= 50/2) is reflected and amplified by a factor of three (due to relative device sizes) onto transistor 604 (W/L=150/2). When the differential voltage between output lead 371 and input lead 454 is close to zero volts, the current in transistor 602 (W/L=250/2) is substantially the same as the current in transistor 601, which is half the current flowing in transistor 608 (W/L=250/2). Since the current in transistor 604 is the sum of the currents in transistors 602 and 605, the current in transistor 605, which flows in transistors 606 (W/L=50/1) as well, is twice the current in transistor 601, or the substantially the same current as the current in transistor 608. The current in transistor 606 is reflected and amplified by a factor of two to transistor 609 (W/L=100/1). If the voltage on input lead increases relative to the voltage on input lead 371 (i.e. >0), the current in transistor 601 increases. In response, the currents in transistors 606 and 609 increases to increase the output current. Conversely, if the voltage on input lead 454 falls below the voltage on output lead 371, the currents in transistors 606 and 609 decreases to decrease the output current.

Figure 6:
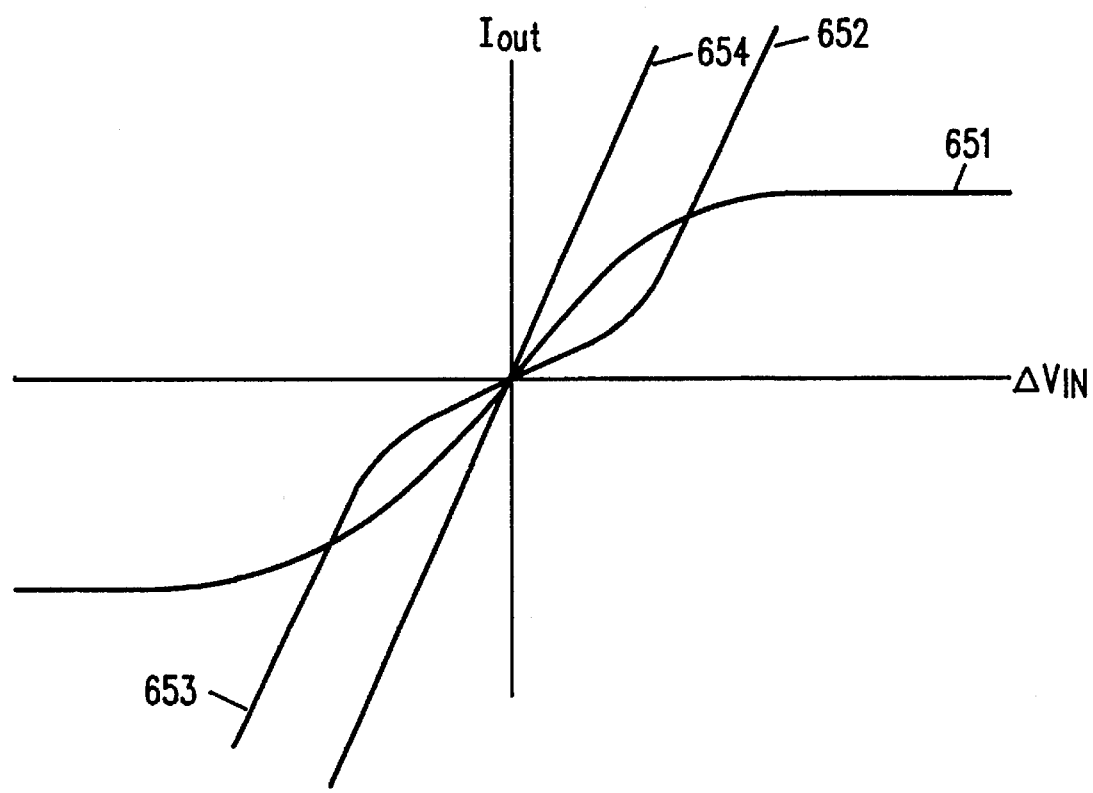
FIG. 6 shows qualitatively the differential voltage at output lead 371 and input lead 454 relative to the output current at output lead 371.

The current characteristic at output lead 371 described above is shown qualitatively in FIG. 6. FIG. 6 shows qualitatively the output current 651 at output lead 371 relative to the differential voltage between input lead 454 and output lead 371. The output current characteristics 652 and 653 of circuits 375 and 376, respectively, are also qualitatively shown in FIG. 6. Current characteristic 654 is the sum of current characteristics 651, 652 and 653, illustrating a relatively linear output current over the operating range of amplifier 508.

As shown in FIG. 6, in the region where the differential voltage on input and output leads 454 and 371 is close to zero volts, a current substantially proportional to this differential voltage is provided at output lead 371. However, when this differential voltage becomes large, i.e. when either power transistor 301 or 302 is on, the current sources provided by transistors 607 and 608 are substantially saturated, leading to a substantially constant output current contribution by circuit 600 at lead 371. The remaining of the current in current characteristic 654 is provided by the conducting one of transistors 302 and 301.

The above detailed description is provided to illustrate the specific embodiments of the present invention and is not intended to be limiting. Many modifications and variations within the scope of the present invention are possible. The present invention is defined by the following claims.

I claim:

1. In an output circuit of an audio system, a circuit for controlling a high side power transistor and a low side power transistor, said circuit comprising:

a low side control circuit, said low side control circuit receiving as input first and second input signals and providing as output first and second output signals, each of said input and output signals having an active state and an inactive state, wherein, when said first input signal is received in said active state, said low side control circuit provides (i) said first output signal in said active state to enable conduction in said low side power transistor, and (ii) said second output signal in said active state, and wherein, when said second input signal is received in said active state, said low side control circuit provides (i) said first output signal in said inactive state to disable conduction in said low side power transistor, and (ii) said second output signal in said inactive state; and a high side control circuit, said high side control circuit receiving as input a third input signal and said second output signal of said low side control circuit, and providing as output a third output signal and said second input signal of said low side control circuit, said third input signal and said third output signal each having an active state and an inactive state, wherein, when said third input signal is received in said active state, said high side control circuit provides (i) said third output signal in said active state to enable conduction in said high side power transistor and (ii) said second input signal of said low side control circuit in said active state, and wherein, when said second output signal is received in said active state, said high side control circuit provides (i) said third output signal in said inactive state to disable conduction in said high side power transistor and (ii) said second input signal of said low side control circuit in said inactive state;.

wherein said first output signal of said low side control circuit is coupled to a gate terminal of a transistor, said transistor being connected such that a drain terminal of said transistor provides as output said second output signal of said low side control circuit.

2. In an output circuit of an audio system, a circuit for controlling a high side power transistor and a low side power transistor, said circuit comprising:

a low side control circuit, said low side control circuit receiving as input first and second input signals and providing as output first and second output signals, each of said input and output signals having an active state and an inactive state, wherein, when said first input signal is received in said active state, said low side control circuit provides (i) said first output signal in said active state to enable conduction in said low side power transistor, and (ii) said second output signal in said active state, and wherein, when said second input signal is received in said active state, said low side control circuit provides (i) said first output signal in said inactive state to disable conduction in said low side power transistor, and (ii) said second output signal in said inactive state; and a high side control circuit, said high side control circuit receiving as input a third input signal and said second output signal of said low side control circuit, and providing as output a third output signal and said second input signal of said low side control circuit, said third input signal and said third output signal each having an active state and an inactive state, wherein, when said third input signal is received in said active state, said high side control circuit provides (i) said third output signal in said active state to enable conduction in said high side power transistor and (ii) said second input signal of said low side control circuit in said active state, and wherein, when said second output signal is received in said active state, said high side control circuit provides (i) said third output signal in said inactive state to disable conduction in said high side power transistor and (ii) said second input signal of said low side control circuit in said inactive state;

wherein said third output signal of said high side control circuit is coupled to a gate terminal of a transistor, said transistor being connected such that a drain terminal of said transistor provides as output said second input signal of said low side control circuit.

3. In an output circuit of an audio system, a circuit for controlling a high side power transistor and a low side power transistor, said circuit comprising:

a low side control circuit, said low side control circuit receiving as input first and second input signals and providing as output first and second output signals, each of said input and output signals having an active state and an inactive state, wherein, when said first input signal is received in said active state, said low side control circuit provides (i) said first output signal in said active state to enable conduction in said low side power transistor, and (ii) said second output signal in said active state, and wherein, when said second input signal is received in said active state, said low side control circuit provides (i) said first output signal in said inactive state to disable conduction in said low side power transistor, and (ii) said second output signal in said inactive state; and a high side control circuit, said high side control circuit receiving as input a third input signal and said second output signal of said low side control circuit, and providing as output a third output signal and said second input signal of said low side control circuit, said third input signal and said third output signal each having an active state and an inactive state, wherein, when said third input signal is received in said active state, said high side control circuit provides (i) said third output signal in said active state to enable conduction in said high side power transistor and (ii) said second input signal of said low side control circuit in said active state, and wherein, when said second output signal is received in said active state, said high side control circuit provides (i) said third output signal in said inactive state to disable conduction in said high side power transistor and (ii) said second input signal of said low side control circuit in said inactive state;

wherein said low side control circuit comprises a differential transconductance amplifier.

4. In an output circuit of an audio system, a circuit for controlling a high side power transistor and a low side power transistor, said circuit comprising:

a low side control circuit, said low side control circuit receiving as input first and second input signals and providing as output first and second output signals, each of said input and output signals having an active state and an inactive state, wherein, when said first input signal is received in said active state, said low side control circuit provides (i) said first output signal in said active state to enable conduction in said low side power transistor, and (ii) said second output signal in said active state, and wherein, when said second input signal is received in said active state, said low side control circuit provides (i) said first output signal in said inactive state to disable conduction in said low side power transistor, and (ii) said second output signal in said inactive state; and a high side control circuit, said high side control circuit receiving as input a third input signal and said second output signal of said low side control circuit, and providing as output a third output signal and said second input signal of said low side control circuit, said third input signal and said third output signal each having an active state and an inactive state, wherein, when said third input signal is received in said active state, said high side control circuit provides (i) said third output signal in said active state to enable conduction in said high side power transistor and (ii) said second input signal of said low side control circuit in said active state, and wherein, when said second output signal is received in said active state, said high side control circuit provides (i) said third output signal in said inactive state to disable conduction in said high side power transistor and (ii) said second input signal of said low side control circuit in said inactive state;

wherein said high side control circuit comprises a differential transconductance amplifier.

5. In an output circuit of an audio system, a method for controlling a high side power transistor and a low side power transistor, said method comprising the steps of:

providing a low side control circuit, said low side control circuit receiving as input first and second input signals and providing as output first and second output signals, each of said input and output signals having an active state and an inactive state, wherein, when said first input signal is received in said active state, said low side control circuit provides (i) said first output signal in said active state to enable conduction in said low side power transistor, and (ii) said second output signal in said active state, and wherein, when said second input signal is received in said active state, said low side control circuit provides (i) said first output signal in said inactive state to disable conduction in said low side power transistor, and (ii) said second output signal in said inactive state; and providing a high side control circuit, said high side control circuit receiving as input a third input signal and said second output signal of said low side control circuit, and providing as output a third output signal and said second input signal of said low side control circuit, said third input signal and said third output signal each having an active state and an inactive state, wherein, when said third input signal is received in said active state, said high side control circuit provides (i) said third output signal in said active state to enable conduction in said high side power transistor and (ii) said second input signal of said low side control circuit in said active state, and wherein, when said second output signal is received in said active state, said high side control circuit provides (i) said third output signal in said inactive state to disable conduction in said high side power transistor and (ii) said second input signal of said low side control circuit in said inactive state;

wherein said step of providing a low side control circuit comprises the steps of:
coupling said first output signal of said low side control circuit to a gate terminal of a transistor; and
coupling a drain terminal of said transistor to provide as output said second output signal of said low side control circuit.

6. In an output circuit of an audio system, a method for controlling a high side power transistor and a low side power transistor, said method comprising the steps of:

providing a low side control circuit, said low side control circuit receiving as input first and second input signals and providing as output first and second output signals, each of said input and output signals having an active state and an inactive state, wherein, when said first input signal is received in said active state, said low side control circuit provides (i) said first output signal in said active state to enable conduction in said low side power transistor, and (ii) said second output signal in said active state, and wherein, when said second input signal is received in said active state, said low side control circuit provides (i) said first output signal in said inactive state to disable conduction in said low side power transistor, and (ii) said second output signal in said inactive state; and providing a high side control circuit, said high side control circuit receiving as input a third input signal and said second output signal of said low side control circuit, and providing as output a third output signal and said second input signal of said low side control circuit, said third input signal and said third output signal each having an active state and an inactive state, wherein, when said third input signal is received in said active state, said high side control circuit provides (i) said third output signal in said active state to enable conduction in said high side power transistor and (ii) said second input signal of said low side control circuit in said active state, and wherein, when said second output signal is received in said active state, said high side control circuit provides (i) said third output signal in said inactive state to disable conduction in said high side power transistor and (ii) said second input signal of said low side control circuit in said inactive state;

wherein said step of providing a high side control circuit comprises the steps of:
coupling said third output signal of said high side control circuit to a gate terminal of a transistor; and
coupling a drain terminal of said transistor to provide as output said second input signal of said low side control circuit.

7. In an output circuit of an audio system, a method for controlling a high side power transistor and a low side power transistor, said method comprising the steps of:

providing a low side control circuit, said low side control circuit receiving as input first and second input signals and providing as output first and second output signals, each of said input and output signals having an active state and an inactive state, wherein, when said first input signal is received in said active state, said low side control circuit provides (i) said first output signal in said active state to enable conduction in said low side power transistor, and (ii) said second output signal in said active state, and wherein, when said second input signal is received in said active state, said low side control circuit provides (i) said first output signal in said inactive state to disable conduction in said low side power transistor, and (ii) said second output signal in said inactive state; and providing a high side control circuit, said high side control circuit receiving as input a third input signal and said second output signal of said low side control circuit, and providing as output a third output signal and said second input signal of said low side control circuit, said third input signal and said third output signal each having an active state and an inactive state, wherein, when said third input signal is received in said active state, said high side control circuit provides (i) said third output signal in said active state to enable conduction in said high side power transistor and (ii) said second input signal of said low side control circuit in said active state, and wherein, when said second output signal is received in said active state, said high side control circuit provides (i) said third output signal in said inactive state to disable conduction in said high side power transistor and (ii) said second input signal of said low side control circuit in said inactive state;

wherein said step of providing a low side control circuit comprises the step of providing a differential transconductance amplifier.

8. In an output circuit of an audio system, a method for controlling a high side power transistor and a low side power transistor, said method comprising the steps of:

providing a low side control circuit, said low side control circuit receiving as input first and second input signals and providing as output first and second output signals, each of said input and output signals having an active state and an inactive state, wherein, when said first input signal is received in said active state, said low side control circuit provides (i) said first output signal in said active state to enable conduction in said low side power transistor, and (ii) said second output signal in said active state, and wherein, when said second input signal is received in said active state, said low side control circuit provides (i) said first output signal in said inactive state to disable conduction in said low side power transistor, and (ii) said second output signal in said inactive state; and providing a high side control circuit, said high side control circuit receiving as input a third input signal and said second output signal of said low side control circuit, and providing as output a third output signal and said second input signal of said low side control circuit, said third input signal and said third output signal each having an active state and an inactive state, wherein, when said third input signal is received in said active state, said high side control circuit provides (i) said third output signal in said active state to enable conduction in said high side power transistor and (ii) said second input signal of said low side control circuit in said active state, and wherein, when said second output signal is received in said active state, said high side control circuit provides (i) said third output signal in said inactive state to disable conduction in said high side power transistor and (ii) said second input signal of said low side control circuit in said inactive state;

wherein said step of providing a high side control circuit comprises the step of providing a differential transconductance amplifier.

* * * * *